United States Patent [19]
Ward et al.

[11] Patent Number: 5,707,947
[45] Date of Patent: *Jan. 13, 1998

[54] ORGANIC STRIPPING COMPOSITION

[75] Inventors: Irl E. Ward, Bethlehem; Francis W. Michelotti, Easton, both of Pa.

[73] Assignee: Ashland Inc., Dublin, Ohio

[*] Notice: The term of this patent shall not extend beyond the expiration date of Pat. No. 5,417,877.

[21] Appl. No.: 686,125

[22] Filed: Jul. 23, 1996

Related U.S. Application Data

[63] Continuation of Ser. No. 501,206, Jul. 11, 1995, Pat. No. 5,556,482, which is a continuation-in-part of Ser. No. 433,677, May 4, 1995, which is a continuation-in-part of Ser. No. 983,257, Nov. 30, 1992, Pat. No. 5,417,877, which is a continuation-in-part of Ser. No. 647,487, Jan. 25, 1991, abandoned.

[51] Int. Cl.$^6$ .................... C11D 7/26; C11D 7/32; C11D 7/50; B08B 3/08

[52] U.S. Cl. .............. 510/176; 510/175; 510/401; 510/402; 510/255; 510/499; 510/505; 510/405; 134/2; 134/38; 134/40

[58] Field of Search ............... 252/156, 158, 252/171, 173, 548, 387, 392, 396, DIG. 8, 364; 134/2, 38, 40; 430/329; 510/176, 175, 401, 402, 255, 499, 505, 405

[56] References Cited

U.S. PATENT DOCUMENTS

| | | | |
|---|---|---|---|
| 4,165,295 | 8/1979 | Vander Mey | 252/143 |
| 4,168,989 | 9/1979 | Edelman et al. | 134/38 X |
| 4,215,005 | 7/1980 | Vander Mey | 252/153 |
| 4,221,674 | 9/1980 | Vander Mey | 252/141 |
| 4,294,729 | 10/1981 | Bakos et al. | 134/38 X |
| 4,395,348 | 7/1983 | Lee | 134/38 X |
| 4,487,708 | 12/1984 | Muccitelli | 252/178 |
| 4,617,251 | 10/1986 | Sizensky | 430/256 |
| 4,626,411 | 12/1986 | Nemes et al. | 422/13 |
| 4,744,834 | 5/1988 | Haq | 134/38 |
| 4,765,844 | 8/1988 | Merrem et al. | 134/38 |
| 4,789,406 | 12/1988 | Holder et al. | 134/3 |
| 4,844,780 | 7/1989 | Lee | 204/44.4 |
| 4,844,832 | 7/1989 | Kobayashi et al. | 252/143 |
| 4,888,244 | 12/1989 | Masubuchi et al. | 428/416 |
| 4,929,301 | 5/1990 | Beechko | 156/657 |
| 5,064,469 | 11/1991 | Mack | 106/14.42 |
| 5,091,103 | 2/1992 | Dean et al. | 252/162 |
| 5,185,235 | 2/1993 | Sato et al. | 430/331 |
| 5,279,771 | 1/1994 | Lee | 252/548 |
| 5,308,745 | 5/1994 | Schwarzkopf | 430/329 |
| 5,334,332 | 8/1994 | Lee | 252/548 |
| 5,381,807 | 1/1995 | Lee | 134/38 X |
| 5,407,788 | 4/1995 | Fang | 430/318 |
| 5,419,779 | 5/1995 | Ward | 134/38 |
| 5,480,585 | 1/1996 | Shiotsu et al. | 252/544 |
| 5,482,566 | 1/1996 | Lee | 134/42 |
| 5,496,491 | 3/1996 | Ward et al. | 134/38 X |
| 5,556,482 | 9/1996 | Ward et al. | 134/38 |
| 5,561,105 | 10/1996 | Honda | 510/178 |
| 5,563,119 | 10/1996 | Ward | 510/176 |
| 5,597,420 | 1/1997 | Ward | 134/38 |
| 5,648,324 | 7/1997 | Honda et al. | 510/176 |
| 5,665,688 | 9/1997 | Honda et al. | 510/178 |

FOREIGN PATENT DOCUMENTS

| | | |
|---|---|---|
| 196260 | 10/1986 | European Pat. Off. |
| 51-001074 | 1/1976 | Japan |

*Primary Examiner*—Douglas J. McGinty
*Attorney, Agent, or Firm*—John Lezdey

[57] ABSTRACT

Organic stripping composition for photoresists comprising organic polar solvents and basic amines which includes an inhibitor which forms a coordination complex with a metal.

1 Claim, No Drawings

ORGANIC STRIPPING COMPOSITION

RELATED APPLICATIONS

This is a continuation application of Ser. No. 08/501,206, filed Jul. 11, 1995, now U.S. Pat. No. 5,556,482, which is a application is a continuation-in-part of application Ser. No. 08/433,677 filed May 4, 1995 which is a continuation-in-part of application Ser. No. 07/983,257 filed Nov. 30, 1992, now U.S. Pat. No. 5,417,877, which in turn a continuation-in-part of application Ser. No. 07/647,487 filed Jan. 25, 1991, now abandoned.

FIELD OF THE INVENTION

The present invention relates to improved organic compositions containing organic polar solvents and basic amines which are useful as stripping agents in removing polymeric organic substances, such as photoresist from metallic substrates. More particularly, the invention provides a novel inhibition system which prevents corrosion and dulling of the metallic surface.

BACKGROUND OF THE INVENTION

During manufacture of semi-conductors and semi-conductor microcircuits, it is frequently necessary to coat the materials from which the semi-conductors and microcircuits are manufactured with a polymeric organic substance which is generally a photoresist, i.e. a substance which forms an etch resist upon exposure to light. Subsequently, the polymeric organic substance must be removed from the surface of the organic substrate which is typically a silicon dioxide coated silicon wafer and may also contain metallic microcircuitry, such as aluminum, on the surface. Therefore, there is a need for improved stripping compositions which will remove the polymeric organic substance from the coated inorganic substrate without corroding, dissolving or dulling the surface of the metallic circuitry or chemically altering the inorganic substrate.

Organic stripping agents comprising aromatic solvents and basic amines are known for removing organic substances from metallic inorganic substrates. While these stripping agents are effective in removing the polymeric substances, they also have the tendency, especially in the presence of water to corrode the metal or metal alloy comprised, for example of copper, silicon aluminum and/or titanium. It has been proposed in some organic stripping compositions to use hydrogen fluoride to reduce the rate of metal corrosion. However, hydrogen fluoride is harmful to the environment, attacks titanium and creates disposal problems.

Other known inhibitors such as β-naphthol, glucose, hydroquinone resorcinol and benzotriazole have been found to be ineffective to inhibit the pitting of copper when used with a stripping composition comprising organic polar solvents and basic amines.

U.S. Pat. No. 4,617,251 to Sizensky which is herein incorporated by reference, discloses a stripping composition in which the inhibitors of the present invention can be utilized.

British application No. 8428587 discloses stripping compositions comprising amides and amines which can be used with the inhibitors of the invention.

U.S. Pat. No. 5,308,745 to Schwartzkopf discloses an alkaline containing photoresist stripping composition which utilizes weak acids as corrosion inhibitors in an amount to neutralize about 19 to 75% of the amine present.

U.S. Pat. Nos. 5,334,332 and 5,279,771 to Lee disclose a composition containing hydroxylamine, an alkanolamine and a chelating agent which is added to the mixture.

It is an object of this invention to provide improved organic stripping compositions which cleanly and efficiently remove organic photoresist materials and/or sidewall polymers from aluminized or metal alloyed inorganic substrates, particularly aluminized or metal alloyed silicon dioxide, without causing substantial etching of the inorganic substrate or corrosion and dulling of the metallic circuitry exposed or on the surface of the inorganic substrate, even after repeated use at elevated temperatures.

It is also an object of this invention to provide a method for removing polymeric organic substances and/or sidewall polymers from the surfaces of aluminized or metal alloyed inorganic substrates, particularly aluminized silicon dioxide, without causing etching of the inorganic substrate or corrosion and dulling of the metallic circuitry exposed or on the surface of the inorganic substrate.

SUMMARY OF THE INVENTION

In accordance with the present invention there is provided a stripping composition comprising about 50 to 98% by weight of an organic polar solvents and basic amines in combination with an inhibiting system which is effective in aqueous or non-aqueous stripping compositions.

The inhibitors which are used in connection with the present invention are those which are formed by the reaction of an amine containing polar solvent and/or a basic amine and a compound selected from the group of the formula consisting of:

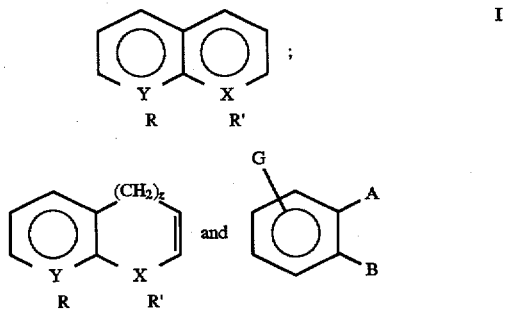

wherein
X represents C, N, or S,
Y represents C, N
R represents —OH, —NR"R", —SR", —NO, NO$_2$ or

z is O, or 1
R' represents —OH, —NR"R", —SR", —NO, NO$_2$ or

wherein
R" represents H or lower alkyl, and
R'" represents lower alkyl or lower alkoxy,
A and B each represent —OH and G represents H, —OH, CO$_2$R", lower alkyl or halo.

Among the preferred compounds of Formula I utilized in forming the inhibitor system in the invention are 2,3-dihydroxybenzoic acid, pyrogallol, 8-amino-4H- chromene, 8-hydroxyquinoline, 7-amino 2,3-benzofuran, 1-hydroxy-8-dialkylaminonaphthalene 1-hydroxy-8-dimethylaminonapthalene, 8-hydroxy-4H-1-benzothiopyran, 8-hydroxy-4H-1-benzothiofuran, 8-methylthiochroman, 8-ditertbutylamino chromene, 1-tertbutoxy-8-nitronaphthalene, 8-alkylketoquinoline, 8-sulfhydrylquinoline, anthranilic acid 8-nitrosoquinoline, 2-hydroxy benzene sulfonamide, catechol, and related ortho-dihydroxy isomers The inhibitors of the invention are formed in situ by admixing a basic amine such as an alkanolamine or a hydroxylamine compound with one of the compounds of formula I, preferably a monocyclic compound. Most preferably, the compound is catechol or pyrogallol.

It has been found that when the monocyclic hydroxylated compound is mixed with an alkanolamine there is immediately formed the phenolate anion which is an oxygen absorbing and chelating agent. That is, if catechol is added to monoethanolamine in an amount less than that which neutralizes less than 19% there is primarily formed a monophenolate salt which is ortho hydroxy monoethanolammonium phenolate that is the inhibitor when placed into a composition containing hydroxyl amine, an alkanolamine and water. It is understood that the phenolate salt can be prepared separately and added to the stripping composition.

Therefore and surprisingly the order of mixing ingredients becomes critical since the phenolate salts formed with alkanol amines, especially monoethanolamine, exhibit better anticorrosive effects than when combined with hydroxylamine compounds or a mixture of other alkanolamines and hydroxylamine compounds either in an aqueous or non-aqueous form.

The inhibitor functions in a non-aqueous stripping composition to provide protection of substrates, which have been sensitized toward corrosion by exposure to a chlorine or fluorine plasma, from dissolved oxygen or amines. In an aqueous stripping composition there is protection of the metal substrate against corrosion caused by dissolved oxygen, hydroxyl ions and/or the amines.

The stripping compositions of this invention suitably comprises a mixture of a polar solvent selected from the group consisting of monoethanolamine, diethanolamine, isopropanolamine or an amide compound of the formula:

II and mixture thereof, wherein R is selected from the group consisting of hydrogen, lower alkyl and phenyl; $R_1$ and $R_2$ are selected from the group consisting of hydrogen and lower alkyl; and R and $R_1$ together with the keto and nitrogen group to which they are attached form a five or six membered ring, a pyrrolidone compound, alkylsulfoxide, and the like, (b) basic amine compounds of the invention include those amines which are also named as polar solvents and compounds of the formula:

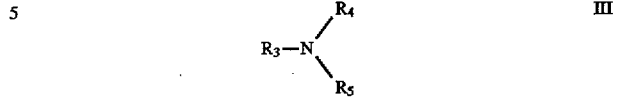

III and mixtures thereof, wherein $R_3$ is selected from the group consisting of —OH, —$C_2H_5$, —$C_2H_4OH$, phenyl and $CH_2CH(OH)CH_3$, $R_4$ is selected from the group consisting of hydrogen, alkanol and phenyl, and $R_5$ is selected from the group consisting of hydrogen, lower alkyl, alkanol and —$C_2H_4OH$, and (c) about 2 to 7% by weight and a non-neutralizing amount of the reaction product of a compound of Formula I and a basic amine which forms a phenolate salt. Higher amounts of the compounds of Formula I causes a reduction in the solvency power and aggressiveness of the amines utilized and therefore reduction in stripping efficacy.

If desired, the stripping composition can comprise up to 50% by weight of water, more preferably up to about 20%. However, it is understood that the hydroxylamine is utilized as a 50% aqueous solution.

Also in accordance with this invention, there is provided a method for stripping a polymeric organic substance from a metallized inorganic substrate comprising contacting the polymeric organic substance with an organic stripping composition of this invention at a temperature of about 20° to about 180° C.

DETAILED DESCRIPTION OF THE INVENTION

The stripping compositions of this invention can comprise from about 50 to about 98%, preferably, from about 20 to about 50%, by weight of a polar solvent or mixture of polar solvents, a basic amine compound or mixture of amines, and about 2 to 7% by weight, preferably from about 5% of an inhibitor formed by the mixture of a compound of Formula I and an alkanolamine.

As examples of suitable amide compounds useful as polar solvents in the compositions of this invention, there may be mentioned, for example, N,N-dimethyl acetamide, N-methyl acetamide, N,N-diethyl acetamide, N,N-dipropylacetamide, N,N-dimethyl propionamide, N,N-diethyl butyramide, N-methylpyrrolidone, N-ethyl-2-pyrrolidone and N-methyl-N-ethyl acetamide, and the like.

Other polar solvents include dimethylsulfoxide (DMSO), monoethanolamine, 2-(2-aminoethylamino)ethanol, triethanolamine, and the like.

As examples of amine compounds useful in the compositions of this invention, there may be mentioned, for example, an aqueous solution of hydroxylamine, morpholine, isopropanolamine 2-aminopicoline, bis(2-ethylhexyl)amine, monoethanolamine monopropanolamine, N-methylaminoethanol etc.

A preferred stripping composition of this invention comprises a mixture consisting of about 18% by weight of hydroxylamine, about 18% by weight of water and the reaction product of 59% by weight of monoethanolamine and 5% by weight of catechol which can be prepared in situ or separately.

The stripping compositions of this invention are especially useful and advantageous for numerous reasons among which may be mentioned the following. The stripping compositions are water miscible, non-corrosive, non-flammable and of low toxicity to humans and the environment. Because of the low ambient vapor pressure of the non-aqueous components they evidence substantially less evaporation than prior compositions and are non-reactive and environmentally compatible. The stripping compositions may be recycled for component recovery or easily disposed of in an environmentally safe manner without the necessity for burdensome safety precautions. Likewise, a portion of the stripped coatings may be readily removed as solids and collected for easy disposal. The stripping compositions of this invention evidence higher stripping efficiency at lower temperatures for a wide variety of coatings and substrates. Moreover, the stripping compositions are easily prepared by simply mixing the components in the proper sequence at room temperature and thus require no special human or environmental safety precautions. Furthermore, the components of the stripping compositions of this invention provide synergistic stripping action and permit readily and substantially complete removal of coatings from substrates.

EXAMPLE 1

A standard corrosion solvent system was used to test a variety of inhibitors for corrosion prevention on two different metal substrates:

1) Pure 100% copper foil;
2) An Al/Cu (2%) metal alloy sputter deposited on top of a silicon substrate as bonding pads and/or line space pairs; and
3) Exposed plasma sensitized metal VIA pattern.

The standard corrosion solvent used for substrate 3 was of the following composition:

MEA—36%
DMAC—50%
$H_2O$—10%
Inhibitor—4%

EXAMPLE 2

Previous tests with the following solvents were performed to assess corrosion propensity on the substrates of Example 1. Attack was assessed by a change in color of the solvent to blue or blue-green indicating formation of a stable complex of oxidized (i.e. corroded) copper. SEMS analysis was used to assess attack on substrate 2. The solvents included:

1) DMA
2) DMF
3) Tetrahydrofurfuryl alcohol (THFA)
4) N-Methylpyrrolidone (NMP)

For substrate 1, pure copper foil was exposed at ambient temperatures for 22 hours in a pyrex beaker covered with aluminum foil. A change in solvent color was observed. For substrate 2, a foil with patterned Al/Cu designs were immersed in each solvent heated to 75°–80° for 60 minutes followed by a dionized water rinse and nitrogen blow-dry. The substrates were examined by SEM for the integrity of the exposed metal alloy line space pairs.

Results

SEM observation of alloy metal attack was used to assess corrosion of substrate 2 above. The solvents included those compounds consistent with those listed above which did not undercut the substrates.

None of the solvents showed any effect at all on substrates 1 or 2 above.

EXAMPLE 3

Several amines (i.e., which are known to form stable complexes with Cu and can be strong corrosives) were tested using the same color-change indicator as above on substrate 1 above. The tests are summarized below for exposures of 22 hrs at room temperature.

| Component | Color | Rating* | Results |
|---|---|---|---|
| DMA | Clear | 0 | No attack |
| MEA | Light blue | 2–3 | Slight Cu attack |
| Hydroxylamine | Light blue | 2–3 | Slight to moderate attack |
| Morpholine | Light–mod. blue | 2–3 | Slight Cu attack |
| 1-Amino-2 Propanol | Moderate blue | 5 | Mod. Cu attack |
| Ammonium Hydroxide | Deep blue | 10 | Heavy attack |
| Triethanolamine | Clear | 0 | No attack |
| 2-(2 Aminoethoxy) Ethanol | Blue–green | 5–6 | Mod. attack |
| 3-Methoxypropylamine | Green | 4–5 | Mod. attack |
| 2-Amino-3-Picoline | Clear | 0 | No attack |

Scale: 0 ⇒ No color change, no attack
10 ⇒ Deep opaque blue, heavy attack

These studies clearly point out that the amine in a formulation, is responsible for metal corrosion, not just for Cu, but for many different metals including Al, Ti, Cu, Cr, Al/Cu, etc. This fact is also established in standard electrochemical potentials of these metals, which show a greater propensity for metal oxidation (i.e. corrosion) in an $NH_3$ or $R-NH_2$ environment.

EXAMPLE 4

The standard formulation of Example 3 was employed with a wide range of inhibitors and tested for corrosion using three different methods of determination:

1) For Cu substrates actual ICP (inductive coupled plasma) measurements of the copper extracted into the corrosive solution.
2) Microscopic examination of Cu surface before and after exposure to the test solution i.e. reference formulation plus inhibitor).
3) DF/BF microscopic examination of "pitting" corrosion on Al/Cu alloy substrates before and after exposure to test solution.

INHIBITOR TEST DATA

| Inhibitor | Substrate | Test Method | Results |
|---|---|---|---|
| REF. BLANK | 100% Cu | (1) | 124 ppm |
| | | (2) | Severe pitting, dull mat finish |
| | Al/Cu (2%) | (3) | Large increase "black spot" pitting over unexposed pad (pitting over 100% of pads) |
| PYROGALLOL | 100% Cu | (1) | 10.4 ppm |
| | | (2) | High sheen, no pits |
| RESORCINOL | Al/Cu (2%) | (3) | Visual pitting on 30% of pads |
| GLUCOSE | Al/Cu (2%) | — | Does not dissolve in Ref. blank |
| 8-HYDROXYQUINOLINE | 100% Cu | (2) | High sheen, no pitting |
| | Al/Cu (2%) | (3) | No observable pits (<1% of pads show increase pitting over "before" subst.) |

INHIBITOR TEST DATA -continued

| Inhibitor | Substrate | Test Method | Results |
|---|---|---|---|
| (BHT) Di-t-butyl hydroxy toluene | 100% Cu | (1) | 57 ppm (Ref. blank = 174 ppm) |
| | | (2) | Mod–severe blotching and substrate attack |

EXAMPLE 5

A preferred stripping composition and inhibitor system is prepared as follows:

| Ingredient | Wt % |
|---|---|
| Monoethanolamine (MEA) | 59.2 |
| Hydroxylamine (50% Aqueous solution) | 36.1 |
| Catechol | 4.7 |

In a plantwise operation 592 lbs. of MEA is poured into a stainless steel blender and recirculated for 10–15 minutes through a 0.2 μm filter system.

Into a separate container of 47 lbs. of catechol is added with stirring sufficient MEA to dissolve the catechol and to form the phenolate salt. This solution is then added to the blender containing the MEA. To this solution is added 361 lbs. of a 50% aqueous solution of hydroxylamine obtained from Nissin Chemical Industry, Inc., Tokyo, Japan to form the final solution.

The identification of the phenolate anion was determined by packed column thermal conductivity GC, by H-NMR (proton nuclear magnetic resonance spectroscopy), and by I.R. (infrared) spectroscopy.

What is claimed is:

1. In an aqueous stripping composition for removing coatings from a substrate wherein said stripping composition consists of stripping effective amounts of more than about 50 wt % up to about 98 wt % organic polar solvent, up to about 20 wt % water, and a basic amine, the improvement wherein said composition is an admixture which further consists of an effective inhibiting amount a compound of the formula:

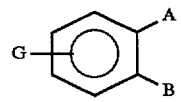

wherein G is hydrogen and A and B are hydroxyl, and said polar solvent and said basic amine are different.

* * * * *